United States Patent
Javadiabhari et al.

(10) Patent No.: US 11,194,642 B2
(45) Date of Patent: Dec. 7, 2021

(54) NOISE AND CALIBRATION ADAPTIVE COMPILATION OF QUANTUM PROGRAMS

(71) Applicant: International Business Machines Corporation, Armonk, NY (US)

(72) Inventors: Ali Javadiabhari, Sleepy Hollow, NY (US); Jay M. Gambetta, Yorktown Heights, NY (US); Andrew W. Cross, Yorktown Heights, NY (US); David C. Mckay, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 512 days.

(21) Appl. No.: 16/204,647

(22) Filed: Nov. 29, 2018

(65) Prior Publication Data

US 2020/0174879 A1 Jun. 4, 2020

(51) Int. Cl.
*H03K 19/195* (2006.01)
*G06F 11/07* (2006.01)
*G06N 10/00* (2019.01)

(52) U.S. Cl.
CPC ......... *G06F 11/0721* (2013.01); *G06N 10/00* (2019.01); *H03K 19/195* (2013.01)

(58) Field of Classification Search
CPC ... G06F 11/0721; G06N 10/00; H03K 19/195
See application file for complete search history.

(56) References Cited

U.S. PATENT DOCUMENTS

| | | |
|---|---|---|
| 10,031,791 B1 | 7/2018 | Wallman et al. |
| 2003/0121028 A1 | 6/2003 | Coury et al. |
| 2016/0171368 A1* | 6/2016 | Aspuru-Guzik ....... G06N 5/003 706/46 |
| 2016/0328253 A1 | 11/2016 | Majumdar |
| 2017/0308803 A1 | 10/2017 | Wallman et al. |
| 2017/0330101 A1 | 11/2017 | Hastings et al. |
| 2018/0260730 A1 | 9/2018 | Reagor et al. |

(Continued)

FOREIGN PATENT DOCUMENTS

WO 2015060915 A2 4/2015

OTHER PUBLICATIONS

Tannu et al., "Not All Qubits Are Created Equal", Architectural Support for Programming Languages and Operating Systems, vol. 1805. No. v1, May 25, 2018 (Year: 2018).*

(Continued)

*Primary Examiner* — Kurtis R Bahr
(74) *Attorney, Agent, or Firm* — Garg Law Firm, PLLC; Rakesh Garg; Joseph Petrokaitis

(57) ABSTRACT

A method includes executing a calibration operation on a set of qubits, in a first iteration, to produce a set of parameters, a first subset of the set of parameters corresponding to a first qubit of the set of qubits, and a second subset of the set of parameters corresponding to a second qubit of the set of qubits. In an embodiment, the method includes selecting the first qubit, responsive to a parameter of the first subset meeting an acceptability criterion. In an embodiment, the method includes forming a quantum gate, responsive to a second parameter of the second subset failing to meet a second acceptability criterion, using the first qubit and a third qubit.

20 Claims, 11 Drawing Sheets

(56) References Cited

U.S. PATENT DOCUMENTS

2018/0260732 A1\* 9/2018 Bloom ................ H03K 19/195
2018/0269906 A1 9/2018 Haah et al.

OTHER PUBLICATIONS

Alwin Zulehner et al., An Efficient Methodology for Mapping Quantum circuits to the IBM QX Architectures, Jun. 7, 2018.
Mckay et al., Three Qubit Randomized Benchmarking, Dec. 18, 2017.
Zhang et al., An efficient quantum circuits optimizing scheme compared with QISKit, Jul. 4, 2018.
Barends et al., Superconducting quantum circuits at the surface code threshold for fault tolerance, Apr. 24, 2014.
Shafaei et al., Optimization of Quantum Circuits for Interaction Distance in Linear Nearest Neighbor Architectures, Department of Electrical Engineering University of Southern California.
Siraichi et al., Qubit Allocation, Association for Computing Machinery, 2018.
Tannu et al., "Not All Qubits Are Created Equal", Architectural Support for Programming Languages and Operati ng Systems, vol. 1805.10224, No. v1, May 25, 2018.
Finigan et al., "Qubit Allocation for Noisy Intermediate-Scale Quantum Computers", arxiv.org, Cornell University Library, Oct. 22, 2018.
International Searching Authority, PCT/EP2019/080689, dated Feb. 17, 2020.

\* cited by examiner

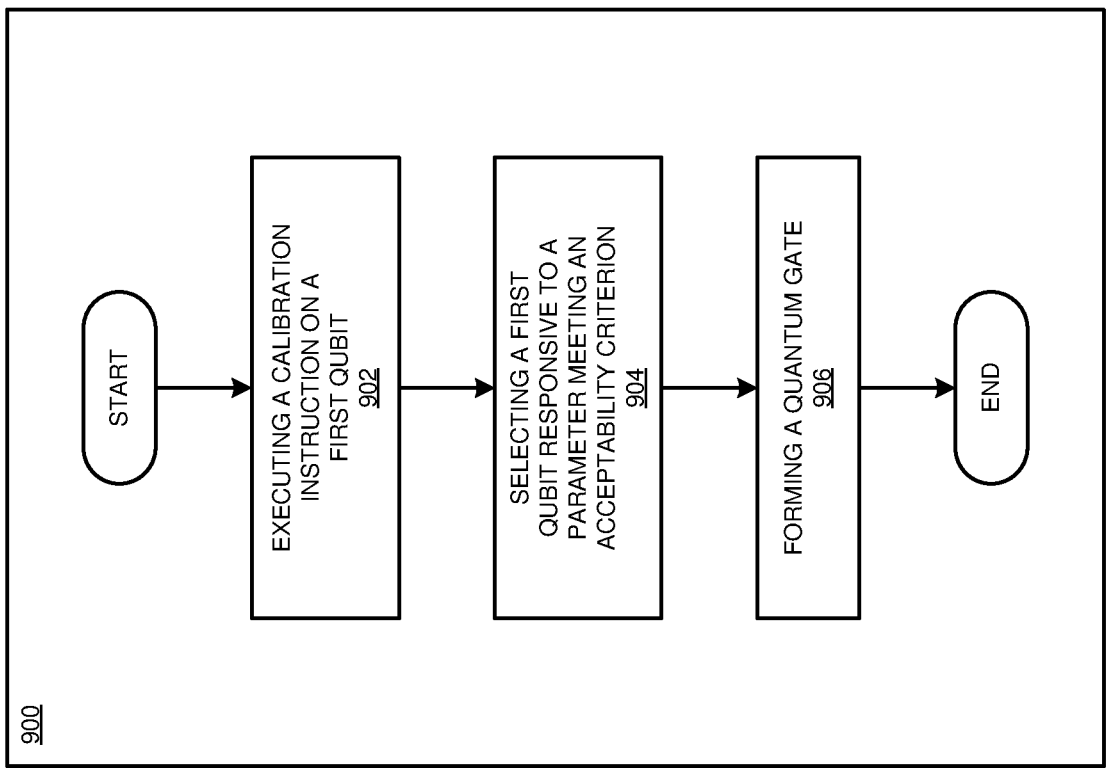

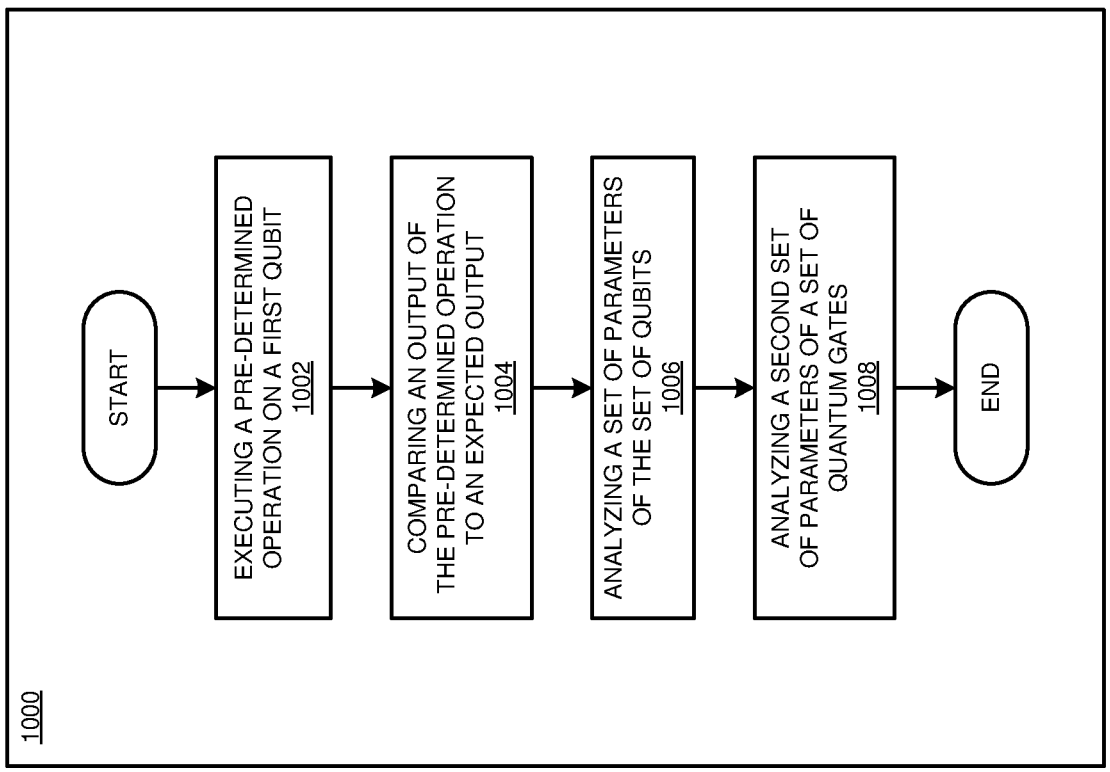

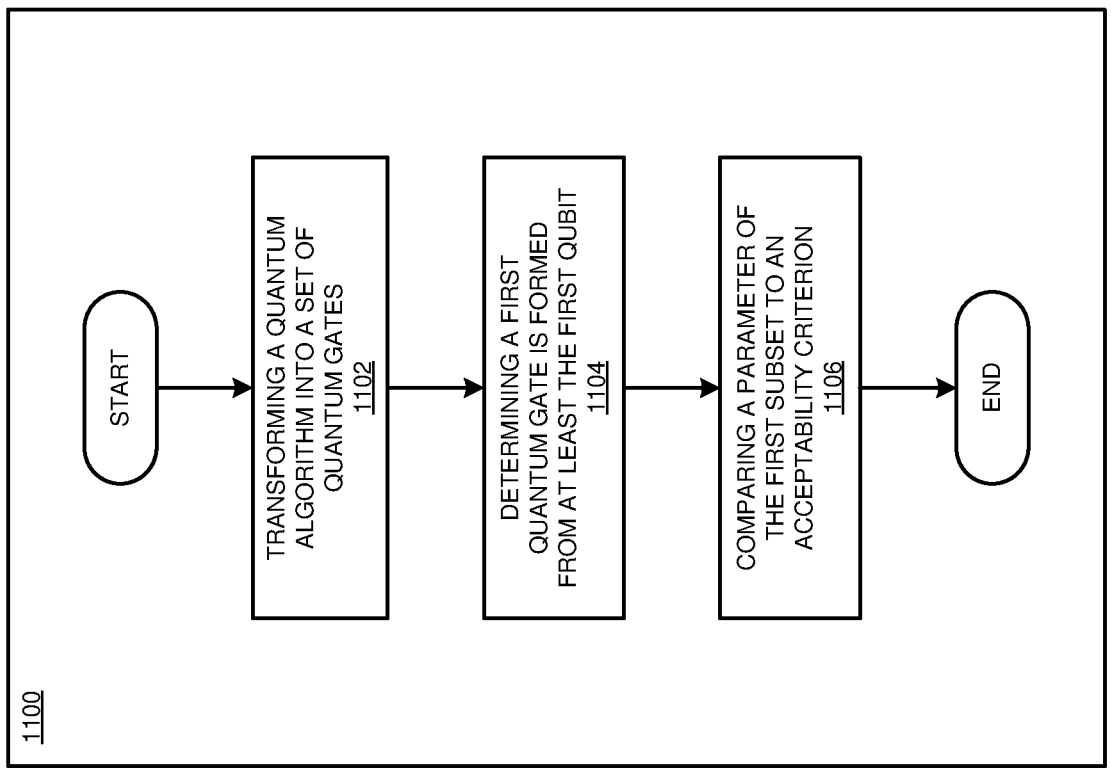

NOISE AND CALIBRATION ADAPTIVE COMPILATION OF QUANTUM PROGRAMS

TECHNICAL FIELD

The present invention relates generally to a method for quantum computing. More particularly, the present invention relates to a method for noise and calibration adaptive compilation of quantum programs.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—$|0\rangle$ and $|1\rangle$. These two states may be two energy states of atoms, for example, the ground ($|g\rangle$) and first excited state ($|e\rangle$) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the $|0\rangle$ and $|1\rangle$ states of the qubit. This operational constraint on any circuit that operates with quantum information necessitates special considerations in fabricating semiconductor and superconducting structures that are used in such circuits.

The illustrative embodiments recognize that quantum processors exhibit varying physical characteristics over a period of time. The illustrative embodiments recognize that calibration of quantum processors determines error rates for associated qubits and quantum gates of the quantum processor. The illustrative embodiments further recognize that quantum processors are often calibrated only once or twice daily.

SUMMARY

The illustrative embodiments provide a method for noise and calibration adaptive compilation of quantum programs. A method of an embodiment includes executing a calibration operation on a set of qubits, in a first iteration, to produce a set of parameters, a first subset of the set of parameters corresponding to a first qubit of the set of qubits, and a second subset of the set of parameters corresponding to a second qubit of the set of qubits.

In an embodiment, the method includes selecting the first qubit, responsive to a parameter of the first subset meeting an acceptability criterion. In an embodiment, the method includes forming a quantum gate, responsive to a second parameter of the second subset failing to meet a second acceptability criterion, using the first qubit and a third qubit.

In an embodiment, the method includes executing the calibration operation on the set of qubits, in a second iteration, to produce a new set of parameters, a new subset of the new set of parameters corresponding to the first qubit of the set of qubits. In an embodiment, the method includes deselecting, responsive to a new parameter of the new subset failing to meet the acceptability criterion, the first qubit. In an embodiment, the method includes forming the quantum gate using a fourth qubit and a fifth qubit.

In an embodiment, executing the calibration operation includes executing a pre-determined operation on the first qubit. In an embodiment, executing the calibration operation includes comparing an output of the pre-determined operation to an expected output.

In an embodiment, selecting the first qubit includes transforming a quantum algorithm into a set of quantum gates, each quantum gate of the set of quantum gates formed from a subset of the set of qubits. In an embodiment, selecting the first qubit includes determining a first quantum gate is formed from at least the first qubit. In an embodiment, selecting the first qubit includes comparing the parameter of the first subset to the acceptability criterion.

In an embodiment, the acceptability criterion is a measurement error of at most four percent. In an embodiment, the acceptability criterion is a coherence time of at least 50 microseconds.

An embodiment includes a computer usable program product. The computer usable program product includes a computer-readable storage device, and program instructions stored on the storage device.

In an embodiment, the computer usable code is stored in a computer readable storage device in a data processing system, and wherein the computer usable code is transferred over a network from a remote data processing system. In an embodiment, the computer usable code is stored in a computer readable storage device in a server data processing system, and wherein the computer usable code is downloaded over a network to a remote data processing system for use in a computer readable storage device associated with the remote data processing system An embodiment includes a computer system. The computer system includes a processor, a computer-readable memory, and a computer-readable storage device, and program instructions stored on the storage device for execution by the processor via the memory.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 9 depicts a flowchart of an example method for noise and calibration adaptive compilation of quantum programs in accordance with an illustrative embodiment;

FIG. 10 depicts a flowchart of an example method for executing a calibration operation on a set of qubits in accordance with an illustrative embodiment; and FIG. 11 depicts a flowchart of an example method for selecting a qubit in accordance with an illustrative embodiment.

DETAILED DESCRIPTION

The illustrative embodiments used to describe the invention generally address and solve the above-described needs for reducing error rates on qubits and quantum gates in a quantum processor. The illustrative embodiments provide a method for noise and calibration adaptive compilation of quantum programs.

An operation described herein as occurring with respect to a frequency of frequencies should be interpreted as occurring with respect to a signal of that frequency or frequencies. All references to a "signal" are references to a microwave signal unless expressly distinguished where used.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example resistors, inductors, capacitors, and other circuit components are used in the figures and the illustrative embodiments. In an actual fabrication or circuit, additional structures or component that are not shown or described herein, or structures or components different from those shown but for a similar function as described herein may be present without departing the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 1:
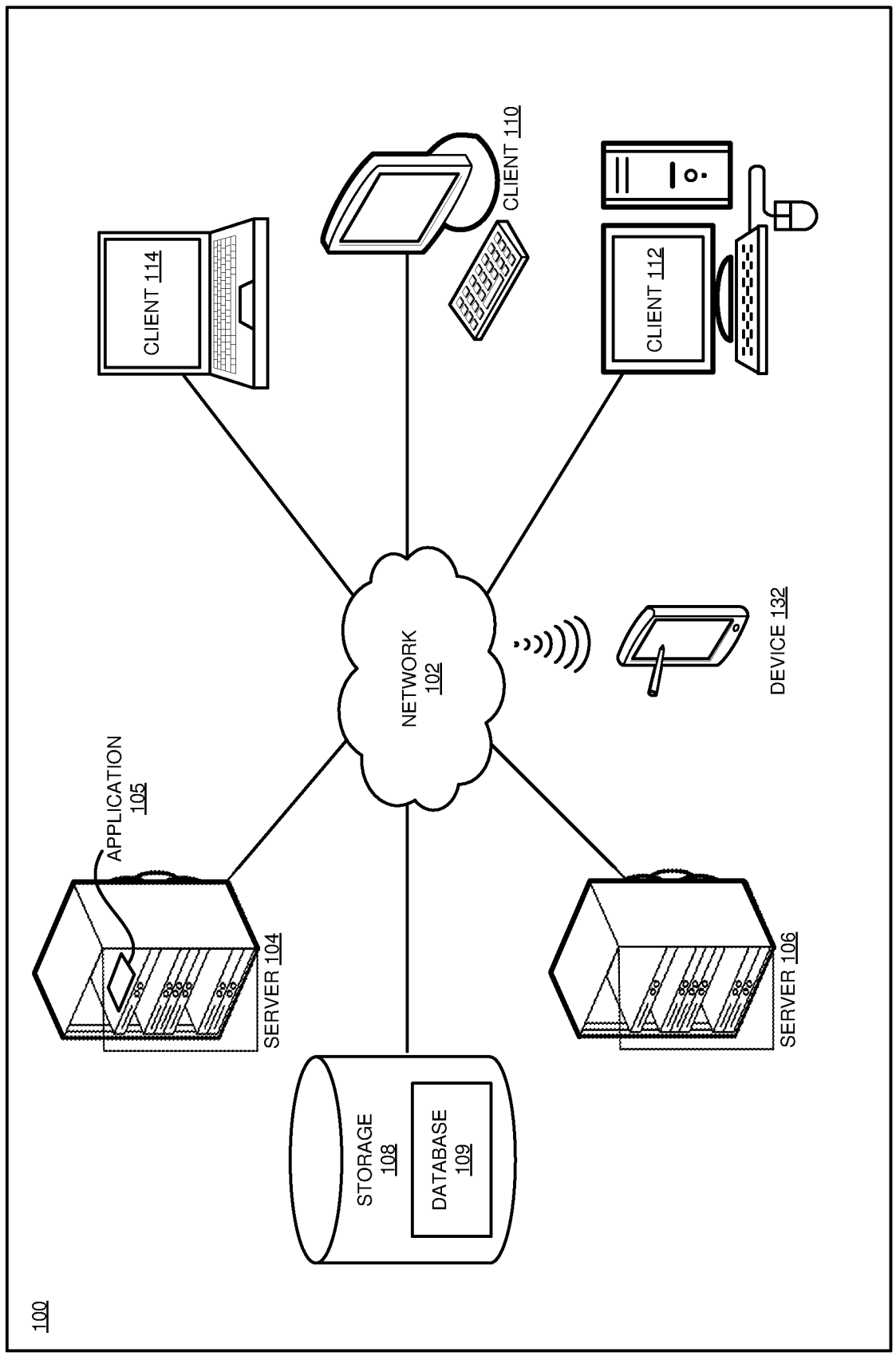
FIG. 1 depicts a block diagram of a network of data processing systems in which illustrative embodiments may be implemented.
Figure 2:
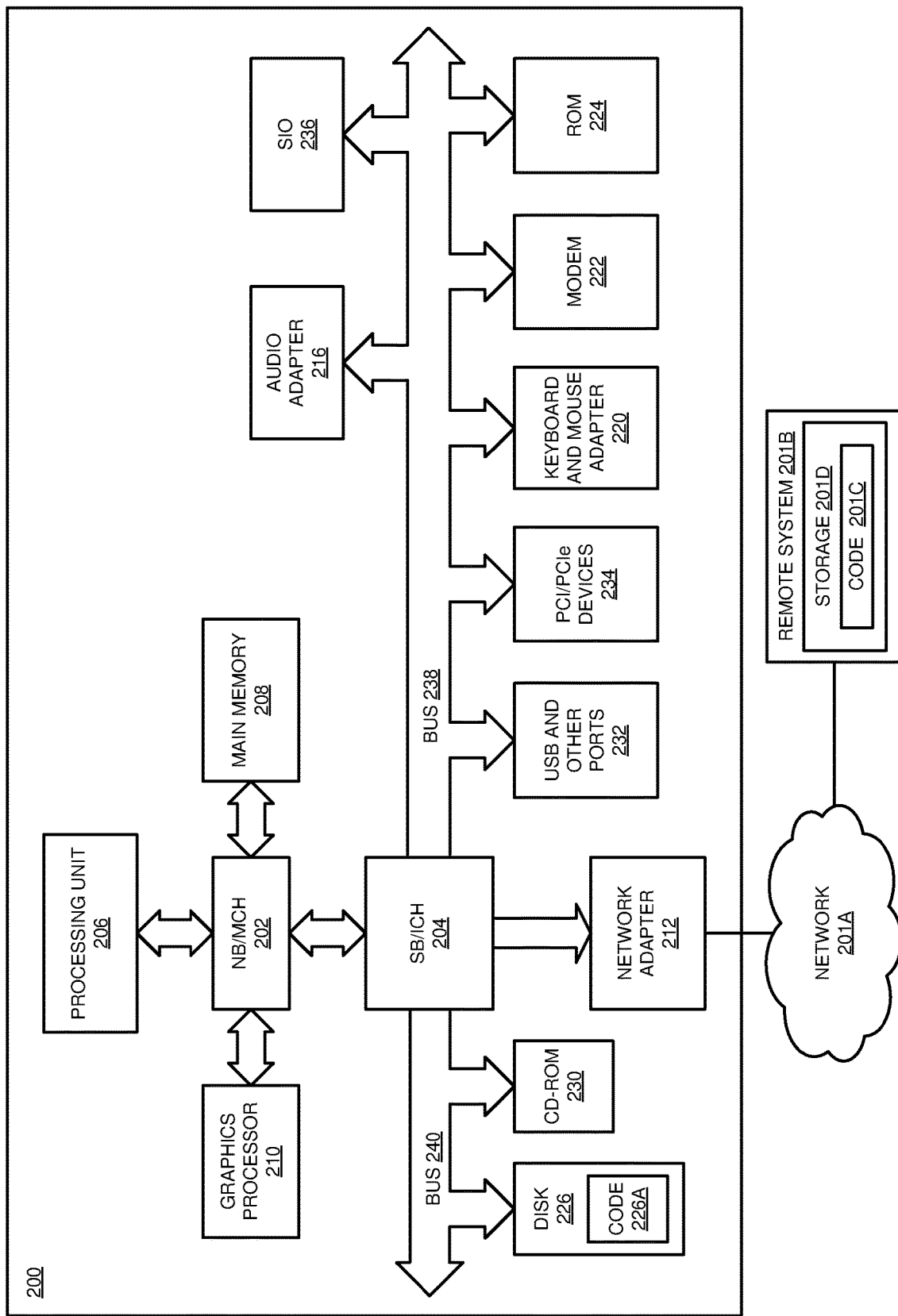
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Servers 104 and 106, storage unit 108, and clients 110, 112, and 114, and device 132 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown. Server 104 includes application 105 that may be configured to implement one or more of the functions described herein for design optimization of a quantum circuit in accordance with one or more embodiments. Storage device 108 includes one or more databases 109 configured to store quantum circuit design information, such as a set of acceptability criteria.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications. Data processing environment 100 may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
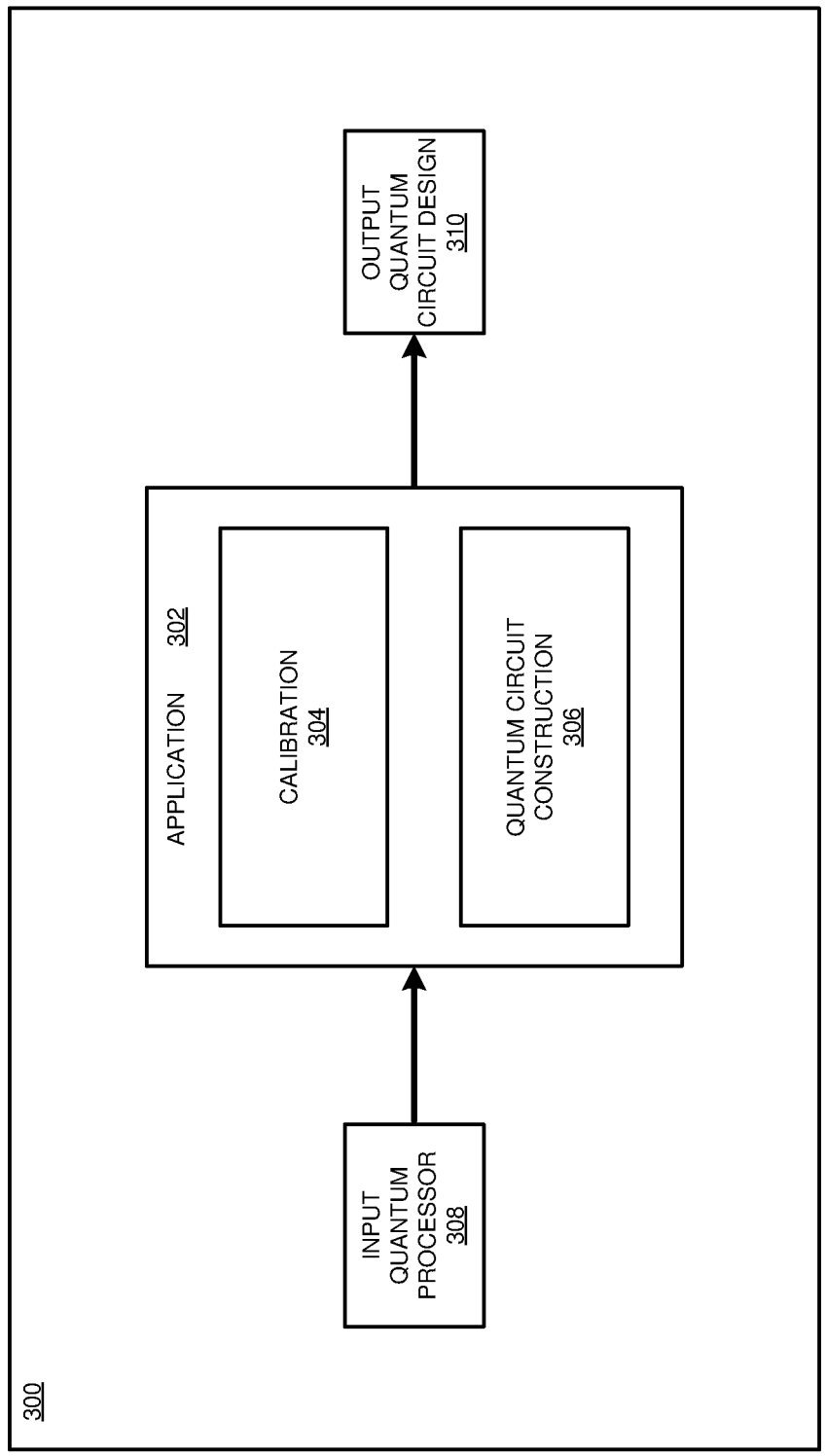
FIG. 3 depicts an example configuration of noise and calibration adaptive compilation of quantum programs in accordance with an illustrative embodiment.

With reference to FIG. 3, this figure depicts an example configuration of noise and calibration adaptive compilation of quantum programs in accordance with an illustrative embodiment. The example embodiment includes an application 302. In a particular embodiment, application 302 is an example of application 105 in FIG. 1. Application 302 includes a calibration component 304 and a quantum circuit construction component 306. Calibration component 304 calibrates an input quantum processor 308 in accordance with an example method described herein. Quantum circuit construction component 306 compiles an output quantum circuit design 310 in accordance with an example method described herein.

Figure 4:
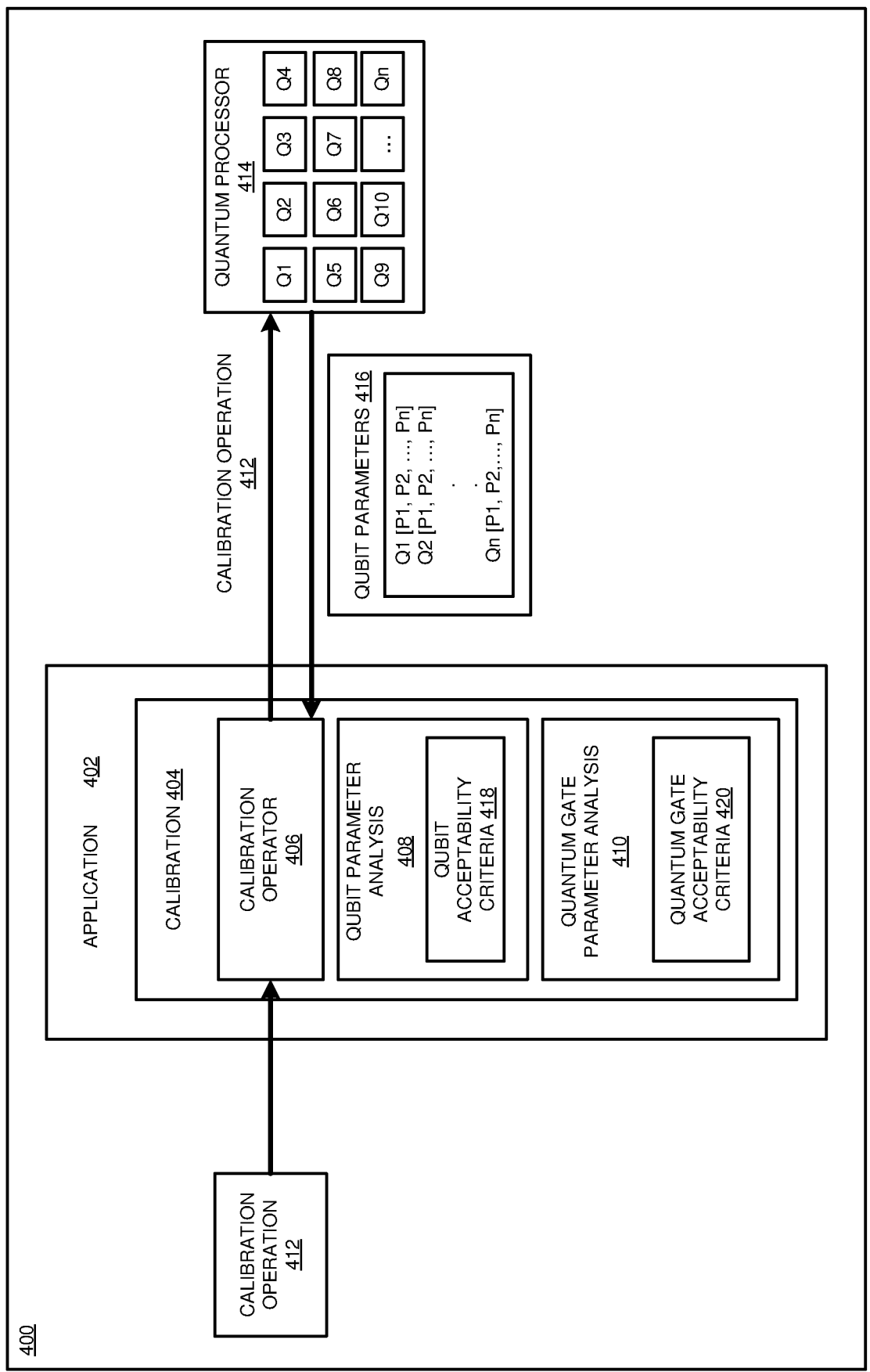
FIG. 4 depicts an example configuration for calibration of a quantum processor in accordance with an illustrative embodiment.

With reference to FIG. 4, this figure depicts an example configuration for calibration of a quantum processor in accordance with an illustrative embodiment. The example embodiment includes an application 402. In a particular embodiment, application 402 is an example of application 105 in FIG. 1.

Application 402 includes calibration component 404. In a particular embodiment, component 404 is an example of component 304 in FIG. 3. Component 404 includes calibration operator component 406, qubit parameter analysis component 408, and quantum gate parameter analysis component 410. Application 402 receives a calibration operation 412.

Calibration operator 406 executes calibration operation 412. In an embodiment, calibration operation 412 performs a set of operations a plurality of qubits Q1, Q2, Q3, . . . , Qn of the quantum processor 414. In an embodiment, calibration operation 412 performs a method of randomized benchmarking. For example, calibration operation 412 can perform a set of pre-determined operations on a plurality of qubits of the quantum processor 414. The set of pre-determined operations generate a set of values for each qubit in response to performing the set of pre-determined operations. In an embodiment, calibration operator 412 compares the set of values for each qubit to an expected answer of at least one of the set of pre-determined operations.

In an embodiment, calibration operation 412 returns a set of qubit parameter values 416 for the plurality of qubits of the quantum processor 414. For example, qubit coherence time, qubit relaxation time, measurement error, and other qubit parameter values can be determined by the calibration operation. Each qubit of the quantum processor 414 can include a subset of the set of parameter values. For example, qubit Q1 can include associated parameter values P1, P2, . . . , Pn, etc. These examples of qubit parameter values are not intended to be limiting. From this disclosure, those of ordinary skill in the art will be able to conceive of many other qubit parameter values suitable for calibrating a set of qubits and the same are contemplated within the scope of the illustrative embodiments.

In an embodiment, calibration operation 412 returns a set of quantum gate parameters. For example, calibration operation 412 can return a parameter corresponding to an error rate for each quantum gate in the quantum processor 414. In an embodiment, calibration operation 412 returns a parameter corresponding to an error rate for each one and two qubit gate (primitive gate) in the quantum processor 414.

Component 408 analyzes the set of qubit parameter values 416. In an embodiment, component 408 analyzes the set of qubit parameter values 416 according to at least one of a set of qubit acceptability criteria 418. For example, component 408 can compare a parameter value of a qubit to a qubit acceptability criterion. For example, component 408 can determine a coherence time of a qubit fails to satisfy a threshold coherence time to perform a set of operations. As another example, component 408 can determine a coherence time of another qubit meets a threshold coherence time to perform the set of operations.

Component 410 analyzes a set of quantum gate parameters. In an embodiment, quantum gate parameters correspond to the set of qubits forming the quantum gate and the layout of the qubits on the quantum processor. In an embodiment, calibration operation 412 returns a set of quantum gate parameters values for a plurality of quantum gates of the quantum processor 414. For example, gate error rates, gate speeds, gate cross talk matrix, and other quantum gate parameter values can be determined by the calibration operation. Each quantum gate of the quantum processor 414 can include a subset of the set of quantum gate parameter values. These examples of quantum gate parameter are not intended to be limiting. From this disclosure, those of ordinary skill in the art will be able to conceive of many other quantum gate parameter values suitable for calibrating a set of quantum gates and the same are contemplated within the scope of the illustrative embodiments.

Component 410 analyzes the set of quantum gate parameter values. In an embodiment, component 410 analyzes the set of quantum gate parameter values according to at least one of a set of quantum gate acceptability criteria 420. For example, component 410 can compare a parameter value of a quantum gate to a quantum gate acceptability criterion. For example, component 410 can determine a gate error rate of a quantum gate fails to satisfy a threshold error rate to perform the quantum gate.

In an embodiment, component 410 generates a composite gate error rate for a composite gate from a set of primitive gate error rates, the composite gate formed from a set of primitive gates corresponding to the primitive gate error rates. In an embodiment, component 410 generates a composite gate error rate for a composite gate formed using three qubits from the formula $$\alpha = \frac{A_{123}B_{12}B_{13}B_{23}}{21}\left(\left(A_{23}B_{23}^{-1} + A_{13}B_{13}^{-1} + A_{12}B_{12}^{-1} + \frac{A_1 + A_2 + A_3}{3} + 9\right)\right),$$

where $A_{xy}$ and $B_{xy}$ are primitive gate error rates for a quantum gate formed from qubits x and y during a first calibration operation and a second calibration operation, respectively.

Figure 5:
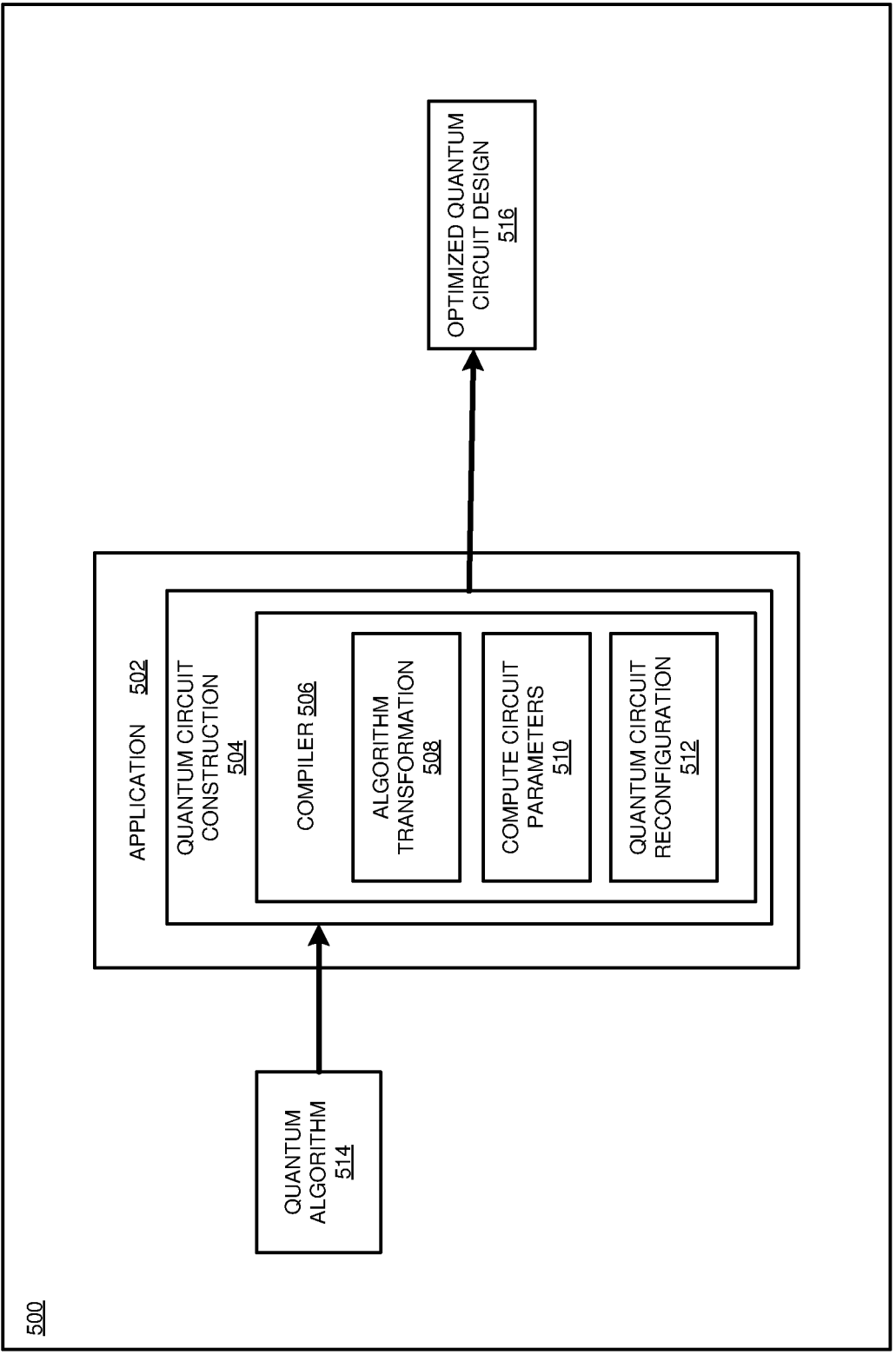
FIG. 5 depicts an example configuration for quantum circuit construction in accordance with an illustrative embodiment.

With reference to FIG. 5, this figure depicts an example configuration for quantum circuit construction in accordance with an illustrative embodiment. The example embodiment includes an application 502. In a particular embodiment, application 502 is an example of application 105 in FIG. 1.

Application 502 includes quantum circuit construction component 504. In a particular embodiment, component 504 is an example of component 306 in FIG. 3. Component 504 includes a quantum circuit compiler component 506. Component 506 is configured to transform an input quantum algorithm 514 into an optimized quantum circuit design 516. Component 516 includes an algorithm transformation component 508, circuit parameter computation component 510, and quantum circuit reconfiguration component 512.

Component 508 transforms the quantum algorithm code into a first quantum circuit design corresponding to the operations performed by the quantum algorithm. In an embodiment, component 510 analyzes the first quantum circuit to determine the qubits and quantum gates used in the first quantum circuit. For example, component 510 determines a first qubit and a second qubit form a first quantum gate. In an embodiment, component 510 determines the first qubit performs a set of operations.

Component 512 reconfigures the quantum circuit in accordance with at least one of a set of qubit acceptability criteria and a set of quantum gate acceptability criteria. In an embodiment, component 512 determines the first qubit meets a qubit acceptability criterion. For example, component 512 can determine first qubit includes a measurement error of three percent, less than a threshold measurement error of four percent. As another example, component 512 can determine the first qubit includes a coherence time of sixty microseconds, greater than a threshold coherence time of fifty microseconds.

In an embodiment, component 512 determines a second qubit fails to meet a qubit acceptability criterion. In response to determining a qubit fails to meet an acceptability criterion, component 512 selects a different qubit to form the quantum gate. Component 512 outputs the optimized quantum circuit design 516.

Figure 6:
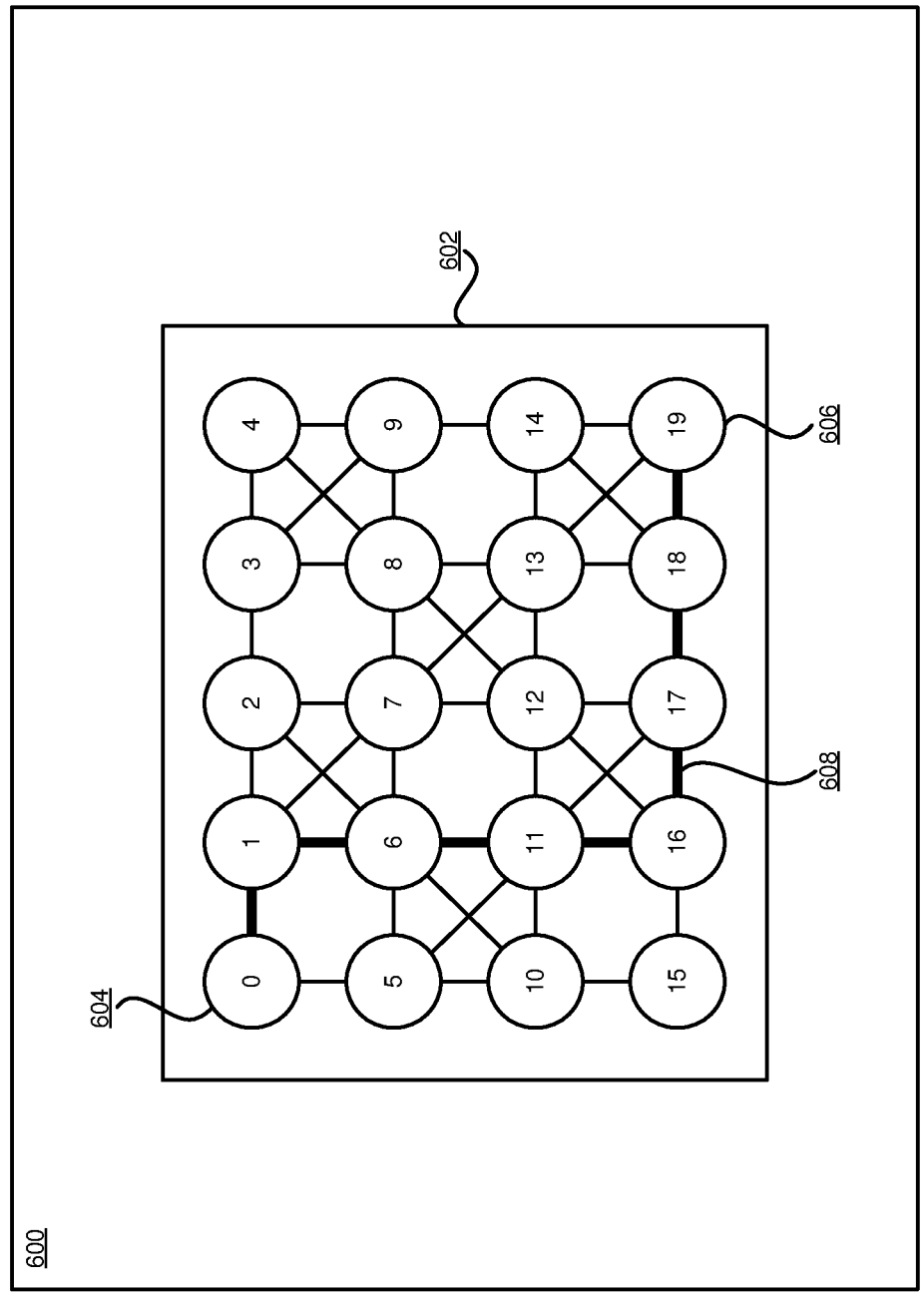
FIG. 6 depicts an example configuration of a connectivity map of a quantum processor in accordance with an illustrative embodiment.

With reference to FIG. 6, this figure depicts an example configuration of a connectivity map of a quantum processor in accordance with an illustrative embodiment. Configuration 600 includes a connectivity map 602 of a quantum processor comprising a set of qubits.

An embodiment configures a quantum gate between qubits 604, 606 in response to transforming a quantum algorithm into a first quantum circuit, the first quantum circuit comprising the quantum gate. For example, application 105 can configure a controlled NOT gate between qubits 604, 606. In an embodiment, application 105 measures the qubits after performing a quantum gate. In an embodiment, qubits 604, 606 are not neighboring qubits. In an embodiment, application 105 moves at least one of the qubits 604, 606 adjacent the other qubit to perform the quantum gate. In an embodiment, application 105 places swap gates on path 608 to connect qubits 604, 606 and form the quantum gate. Swap gates allow neighboring qubits to switch corresponding states. For example, swap gates can be placed to allow qubit 604 to swap states, through a series of swap gates, with a neighboring qubit of qubit 606, and vice versa. As another example, swap gates can be placed to allow both qubit 604 to swap states and qubit 606 to swap states.

In an embodiment, application 105 analyzes a set of parameters of the set of qubits of the connectivity map 602 produced during a first iteration of a calibration operation. In an embodiment, application 105 selects a path to connect qubits 604, 606. In an embodiment, a first iteration of a calibration operation selects path 608 in response to determining path 608 minimizes the error rate for the quantum gate between qubits 604, 606. In an embodiment, application 105 selects path 608 in response to determining path 608 minimizes the cumulative error along a chosen path between qubits 604, 606. In an embodiment, application 105 selects path 608 in response to determining path 608 avoids qubits in the connectivity map 602 with the shortest coherence times.

In an embodiment, application 105 selects the qubits on path 608 with the highest measurement fidelity to perform the quantum gate. For example, application 105 can select qubits 16 and 17 to perform the quantum gate. Application 105 can place swap gates between qubit 0 and qubit 16 and between qubit 17 and qubit 19. In an embodiment, application 105 selects path 608 in response to determining another operation is ongoing while forming the quantum gate. For example, application 105 can determine a CNOT gate is formed between qubits 8 and 9. In an embodiment, application 105 selects path 608 in order to minimize crosstalk between the quantum gate formed between qubits 8 and 9 and the quantum gate formed between qubits 0 and 19.

Figure 7:
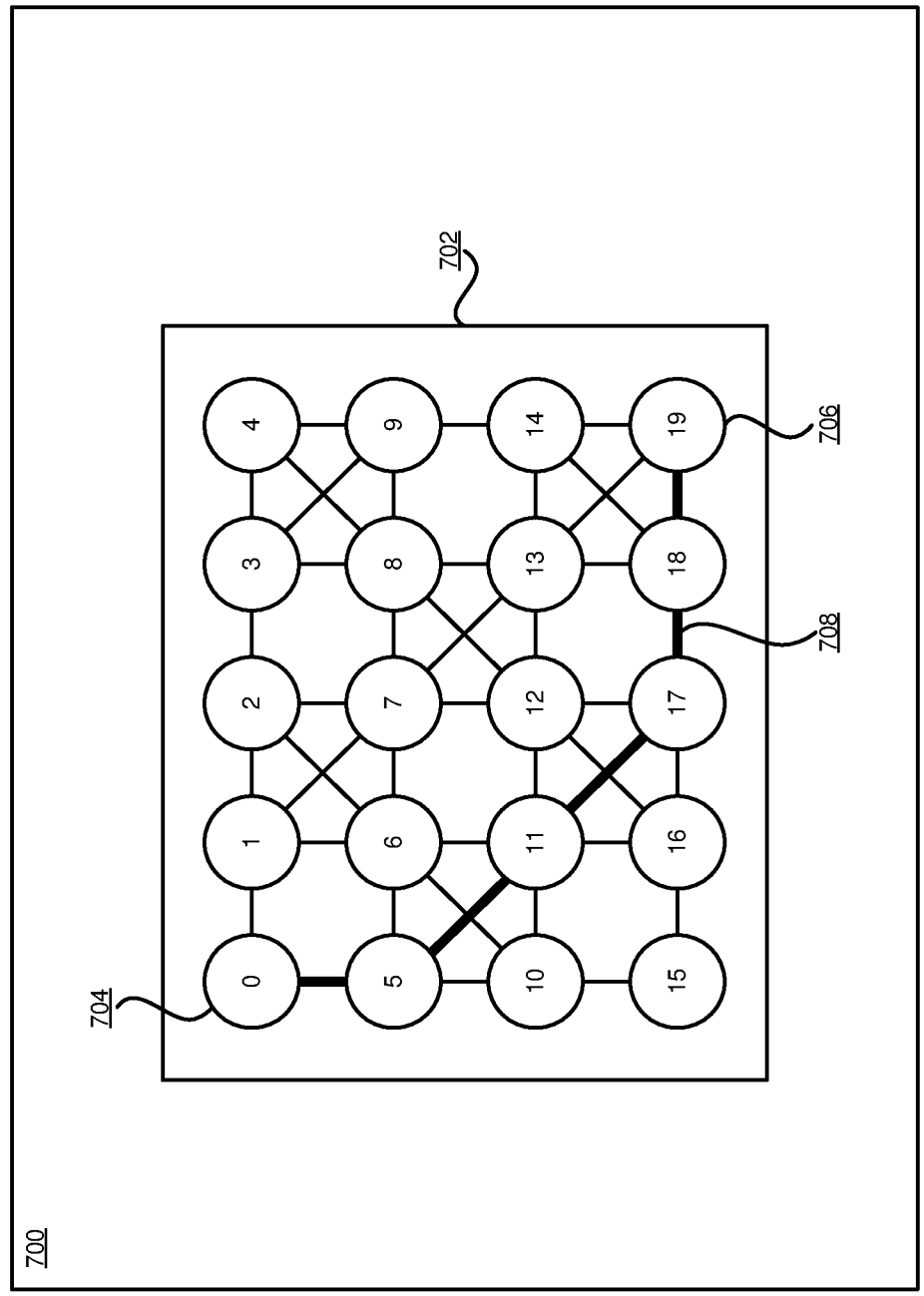
FIG. 7 depicts an example configuration of a connectivity map of a quantum processor in accordance with an illustrative embodiment.

With reference to FIG. 7, this figure depicts an example configuration of a connectivity map of a quantum processor in accordance with an illustrative embodiment. Configuration 700 includes a connectivity map 702 of a quantum processor comprising a set of qubits.

An embodiment configures a quantum gate between qubits 704, 706 in response to transforming a quantum algorithm into a first quantum circuit, the first quantum circuit comprising the quantum gate. In an embodiment, application 105 moves at least one of the qubits 704, 706 adjacent the other qubit to perform the quantum gate. In an embodiment, application 105 places swap gates on path 708 to connect qubits 704, 706 and form the quantum gate. Swap gates allow neighboring qubits to switch corresponding states. For example, swap gates can be placed to allow qubit 704 to swap states, through a series of swap gates, with a neighboring qubit of qubit 706, and vice versa. As another example, swap gates can be placed to allow both qubit 704 to swap states and qubit 706 to swap states.

In an embodiment, application 105 analyzes a set of parameters of the set of qubits of the connectivity map 702 produced during a second iteration of a calibration operation. In an embodiment, application 105 selects a path to connect qubits 704, 706. In an embodiment, a second iteration of the calibration operation selects path 708 in response to determining path 708 minimizes the error rate for the quantum gate between qubits 704, 706. In an embodiment, application 105 selects path 708 in response to determining path 708 minimizes the cumulative error along a chosen path between qubits 604, 606. In an embodiment, application 105 selects path 708 in response to determining path 708 avoids qubits in the connectivity map 702 with the shortest coherence times.

In an embodiment, application 105 selects the qubits on path 708 with the highest measurement fidelity to perform the quantum gate. For example, application 105 can select qubits 5 and 11 to perform the quantum gate. Application 105 can place swap gates between qubit 0 and qubit 5 and between qubit 11 and qubit 19. In an embodiment, application 105 selects path 708 in response to determining another operation is ongoing while forming the quantum gate. For example, application 105 can determine a CNOT gate is formed between qubits 2 and 7. In an embodiment, application 105 selects path 708 in order to minimize crosstalk between the quantum gate formed between qubits 2 and 7 and the quantum gate formed between qubits 0 and 19.

Figure 8:
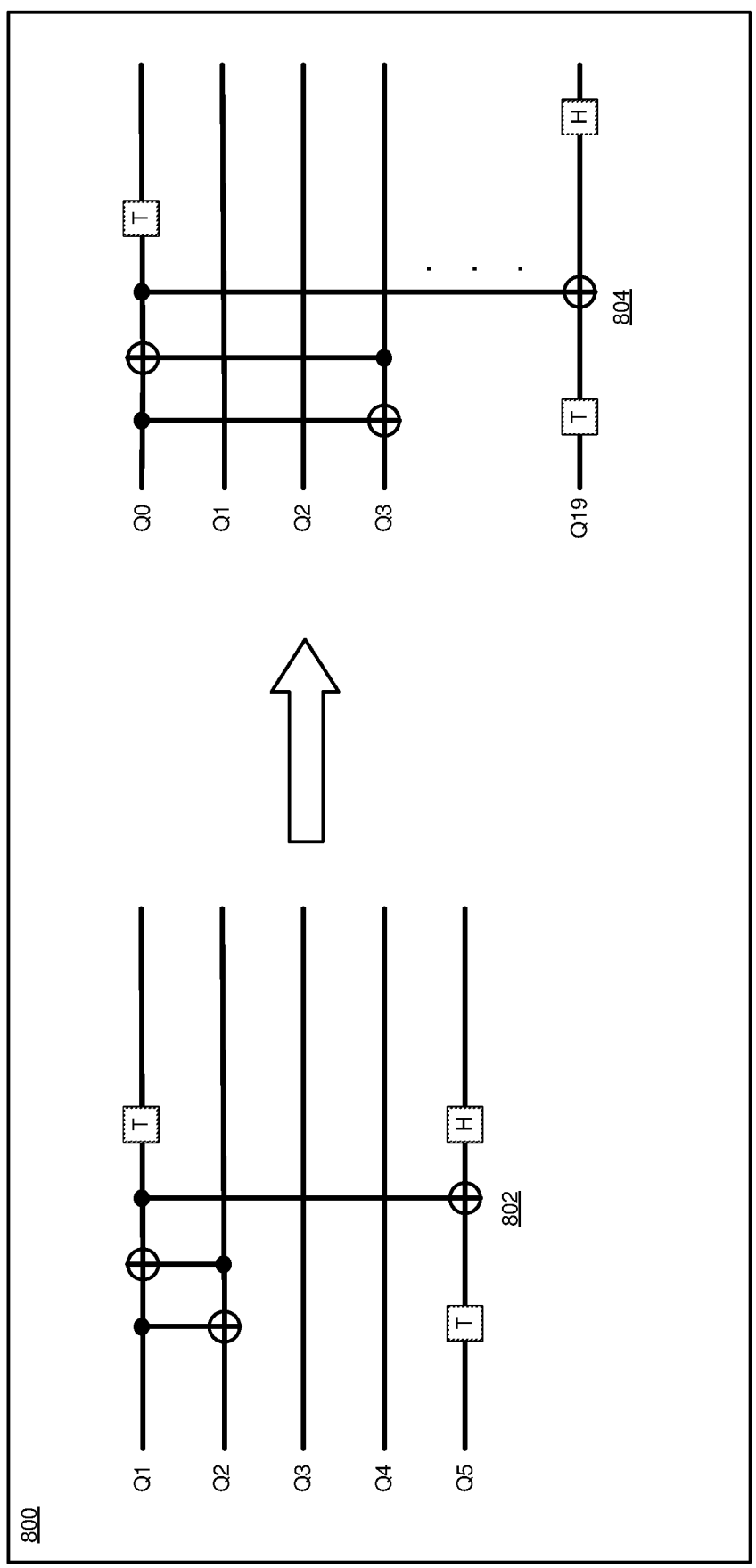
FIG. 8 depicts an example configuration of circuit diagrams in accordance with an illustrative embodiment.

With reference to FIG. 8, this figure depicts an example configuration of circuit diagrams in accordance with an illustrative embodiment. Configuration 800 includes a first circuit diagram 802 and a second circuit diagram 804. In an embodiment, application 105 transforms a quantum algorithm into circuit diagrams 802, 804. In an embodiment, application 105 generates first circuit diagram 802 in response to a first iteration of a calibration operation. In an embodiment, application 105 generates second circuit diagram 804 in response to a second iteration of the calibration operation. In an embodiment, application 105 selects different qubits to form the same quantum gates in response to the second iteration of the calibration operation.

With reference to FIG. 9, this figure depicts a flowchart of an example method for noise and calibration adaptive compilation of quantum programs in accordance with an illustrative embodiment. Application 105 performs method 900 in an embodiment.

In an embodiment, application 105 calibrates a quantum processor in a first iteration. In block 902, application 105 executes a calibration operation on a set of qubits in a first iteration. In an embodiment, the calibration operation produces a set of parameters, a first subset of the set of parameters corresponding to a first qubit of the set of qubits, and a second subset of the set of parameters corresponding to a second qubit of the set of qubits. In an embodiment, application 105 executes a pre-determined operation on the first qubit. In an embodiment, application 105 compares an output of the pre-determined operation to an expected output.

In block 906, application 105 selects the first qubit in response to determining the first qubit meets an acceptability criterion. In an embodiment, application 105 transforms a quantum algorithm into a set of quantum gates, each quantum gate of the set of quantum gates formed from a subset of the set of qubits. In an embodiment, application 105 determines a first quantum gate is formed from at least the first qubit. In an embodiment, application 105 compares the parameter of the first subset to the acceptability criterion.

In block 908, application 105 forms a quantum gate. In an embodiment, application 105 forms a quantum gate, responsive to a second parameter of the second subset failing to meet a second acceptability criterion, using the first qubit and a third qubit. Application 105 ends process 900 thereafter.

In an embodiment, application 105 performs subsequent iterations of method 900. In an embodiment, application 105 executes the calibration operation on the set of qubits, in a second iteration, to produce a new set of parameters, a new subset of the new set of parameters corresponding to the first qubit of the set of qubits. In an embodiment, application 105 deselects, responsive to a new parameter of the new subset failing to meet the acceptability criterion, the first qubit. In an embodiment, application 105 forms the quantum gate using a fourth qubit and a fifth qubit.

With reference to FIG. 10, this figure depicts a flowchart of an example method for executing a calibration operation on a set of qubits in accordance with an illustrative embodiment. Application 105 performs method 1000 at block 902 in an embodiment. In block 1002, application 105 executes a pre-determined operation on a first qubit to generate an output. In an embodiment, an expected output of the pre-determined operation is stored in a database, such as database 109 in FIG. 1.

In block 1004, application 105 compares the generated output from the first qubit to an expected output stored in the database to determine a parameter value for the first qubit. For example, application 105 can determine a difference between the generated output and the expected output to compute an error rate for the first qubit.

In block 1006, application 105 analyzes a set of parameters of the set of qubits. For example, application 105 can compare a subset of the set of parameters to a qubit acceptability criterion. In block 1008, application 105 analyzes a second set of parameters of a set of quantum gates. For example, application 105 can compare a subset of the second set of parameters to a quantum gate acceptability criterion. Application 105 ends process 1000 thereafter.

With reference to FIG. 11, this figure depicts a flowchart of an example method for selecting a qubit in accordance with an illustrative embodiment. Application 105 performs method 1100 at block 904 in an embodiment. In block 1102, application 105 transforms a quantum algorithm into a quantum circuit performing the operations of the quantum algorithm, the quantum circuit comprising a set of quantum gates. In block 1104, application 105 determines a first quantum gate of the set of quantum gates is formed from at least a first qubit of a set of qubits. In block 1106, application 105 compares a parameter of the first qubit determined in a calibration operation to an acceptability criterion. For example, application 105 can compare a coherence time of the first qubit to a threshold time to perform the quantum gate operation. Application 105 ends process 1100 thereafter.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Thus, a computer implemented method, system or apparatus, and computer program product are provided in the illustrative embodiments for managing participation in online communities and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    executing a calibration operation on a set of qubits, in a first iteration, to produce a set of parameters, a first subset of the set of parameters corresponding to a first qubit of the set of qubits, and a second subset of the set of parameters corresponding to a second qubit of the set of qubits;
    selecting the first qubit, responsive to a parameter of the first subset satisfying a threshold parameter value established as an acceptability criterion; and
    forming a quantum gate, responsive to a second parameter of the second subset failing to meet a second acceptability criterion, using the first qubit and a third qubit.

2. The method of claim 1, further comprising:
    executing the calibration operation on the set of qubits, in a second iteration, to produce a new set of parameters, a new subset of the new set of parameters corresponding to the first qubit of the set of qubits;
    deselecting, responsive to a new parameter of the new subset failing to meet the acceptability criterion, the first qubit; and
    forming the quantum gate using a fourth qubit and a fifth qubit.

3. The method of claim 1, executing the calibration operation further comprising:
    executing a pre-determined operation on the first qubit.

4. The method of claim 3, executing the calibration operation further comprising:
    comparing an output of the pre-determined operation to an expected output.

5. The method of claim 1, selecting the first qubit further comprising:
    transforming a quantum algorithm into a set of quantum gates, each quantum gate of the set of quantum gates formed from a subset of the set of qubits.

6. The method of claim 5, selecting the first qubit further comprising:
    determining a first quantum gate is formed from at least the first qubit; and
    comparing the parameter of the first subset to the acceptability criterion.

7. The method of claim 1, wherein the acceptability criterion is a measurement error of at most four percent.

8. The method of claim 1, wherein the acceptability criterion is a coherence time of at least 50 microseconds.

9. A computer usable program product comprising a computer-readable storage device, and program instructions stored on the storage device, the stored program instructions comprising:
    program instructions to execute a calibration operation on a set of qubits, in a first iteration, to produce a set of parameters, a first subset of the set of parameters corresponding to a first qubit of the set of qubits, and a second subset of the set of parameters corresponding to a second qubit of the set of qubits;
    program instructions to select the first qubit, responsive to a parameter of the first subset satisfying a threshold parameter value established as an acceptability criterion; and
    program instructions to form a quantum gate, responsive to a second parameter of the second subset failing to meet a second acceptability criterion, using the first qubit and a third qubit.

10. The computer usable program product of claim 9, wherein the computer usable code is stored in a computer readable storage device in a data processing system, and wherein the computer usable code is transferred over a network from a remote data processing system.

11. The computer usable program product of claim 9, wherein the computer usable code is stored in a computer readable storage device in a server data processing system, and wherein the computer usable code is downloaded over a network to a remote data processing system for use in a computer readable storage device associated with the remote data processing system.

12. The computer usable program product of claim 9, the stored program instructions further comprising:
    program instructions to execute the calibration operation on the set of qubits, in a second iteration, to produce a new set of parameters, a new subset of the new set of parameters corresponding to the first qubit of the set of qubits;
    program instructions to deselect, responsive to a new parameter of the new subset failing to meet the acceptability criterion, the first qubit; and
    program instructions to form the quantum gate using a fourth qubit and a fifth qubit.

13. The computer usable program product of claim 9, program instructions to execute the calibration operation further comprising:
    program instructions to execute a pre-determined operation on the first qubit.

14. The computer usable program product of claim 13, program instructions to execute the calibration operation further comprising:
    program instructions to compare an output of the pre-determined operation to an expected output.

15. The computer usable program product of claim 9, program instructions to select the first qubit further comprising:
    program instructions to transform a quantum algorithm into a set of quantum gates, each quantum gate of the set of quantum gates formed from a subset of the set of qubits.

16. The computer usable program product of claim 15, program instructions to select the first qubit further comprising:
  program instructions to determine a first quantum gate is formed from at least the first qubit; and
  program instructions to compare the parameter of the first subset to the acceptability criterion.

17. The computer usable program product of claim 9, wherein the acceptability criterion is a measurement error of at most four percent.

18. The computer usable program product of claim 9, wherein the acceptability criterion is a coherence time of at least 50 microseconds.

19. A computer system comprising a processor, a computer-readable memory, and a computer-readable storage device, and program instructions stored on the storage device for execution by the processor via the memory, the stored program instructions comprising:
  program instructions to execute a calibration operation on a set of qubits, in a first iteration, to produce a set of parameters, a first subset of the set of parameters corresponding to a first qubit of the set of qubits, and a second subset of the set of parameters corresponding to a second qubit of the set of qubits;
  program instructions to select the first qubit, responsive to a parameter of the first subset satisfying a threshold parameter value established as an acceptability criterion; and
  program instructions to form a quantum gate, responsive to a second parameter of the second subset failing to meet a second acceptability criterion, using the first qubit and a third qubit.

20. The computer system of claim 19, the stored program instructions further comprising:
  program instructions to execute the calibration operation on the set of qubits, in a second iteration, to produce a new set of parameters, a new subset of the new set of parameters corresponding to the first qubit of the set of qubits;
  program instructions to deselect, responsive to a new parameter of the new subset failing to meet the acceptability criterion, the first qubit; and
  program instructions to form the quantum gate using a fourth qubit and a fifth qubit.

\* \* \* \* \*